United States Patent
Oakley et al.

(10) Patent No.: US 7,961,048 B2
(45) Date of Patent: Jun. 14, 2011

(54) INTEGRATED POWER AMPLIFIERS FOR USE IN WIRELESS COMMUNICATION DEVICES

(75) Inventors: Michael Alan Oakley, Durham, NC (US); Dong Ho Lee, Cedar Rapids, IA (US); Kyu Hwan An, Dunwoody, GA (US); Chang-Ho Lee, Marietta, GA (US); Joy Laskar, Marietta, GA (US)

(73) Assignees: Samsung Electro-Mechanics Company (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/623,164

(22) Filed: Nov. 20, 2009

(65) Prior Publication Data

US 2010/0148877 A1 Jun. 17, 2010

Related U.S. Application Data

(60) Provisional application No. 61/122,275, filed on Dec. 12, 2008.

(51) Int. Cl.
*H03F 3/68* (2006.01)
(52) U.S. Cl. .................. 330/295; 330/124 R
(58) Field of Classification Search .......... 330/124 R, 330/295, 286
See application file for complete search history.

(56) References Cited

U.S. PATENT DOCUMENTS

| | | | |
|---|---|---|---|
| 5,568,086 A | 10/1996 | Schuss et al. | |
| 5,574,411 A | 11/1996 | Apel et al. | |
| 5,949,299 A | 9/1999 | Harada | |
| 7,268,616 B2 * | 9/2007 | Burns et al. | 330/124 R |
| 7,479,850 B2 | 1/2009 | Kearns et al. | |

FOREIGN PATENT DOCUMENTS

KR 20030065873 8/2003

OTHER PUBLICATIONS

Winifried Bakalski et al., "Lumped and Distributed Lattice-type LC-Baluns." IEEE MTT-S Digest 2002. pp. 209-212.
Patrick Reynaert et al., "A Fully Integrated CMOS RF Power Amplifier with Parallel Power Combining and Power Control." IEEE 2005. pp. 137-140.
Office Action for Korean Application No. 10- 2009-0124261 dated Feb. 17, 2011.

* cited by examiner

*Primary Examiner* — Khanh V Nguyen
(74) *Attorney, Agent, or Firm* — Sutherland Asbill & Brennan LLP (57) ABSTRACT

An integrated power amplifier can include a carrier amplifier, where the carrier amplifier is connected to a first quarter wave transformer at the input of the carrier amplifier. In addition, the power amplifier can further include at least one peaking amplifier connected in parallel with the carrier amplifier; a first differential combining structure, where the first combining structure includes a first plurality of quarter wave transformers that are configured to combine respective first differential outputs of the carrier amplifier in phase to generate a first single-ended output signal, and a second differential combining structure, where the second combining structures includes a second plurality of quarter wave transformers that are configured to combine respective second differential outputs of the at least one peaking amplifier in phase to generate a second single-ended output signal, where the first single-ended output signal and the second single-ended output signal are combinable in-phase to provide an overall output.

20 Claims, 9 Drawing Sheets

INTEGRATED POWER AMPLIFIERS FOR USE IN WIRELESS COMMUNICATION DEVICES

RELATED APPLICATION

The present application claims priority to U.S. Provisional Application No. 61/122,275, filed on Dec. 12, 2008, and entitled "INTEGRATED POWER AMPLIFIERS FOR USE IN WIRELESS COMMUNICATION DEVICES." The foregoing application is hereby incorporated by reference in its entirety as if fully set forth herein.

FIELD OF INVENTION

Embodiments of the invention relate generally to power amplification circuits, and more particularly, to integrated power amplifiers for use in wireless communication devices such as mobile devices.

BACKGROUND OF THE INVENTION

Power amplifiers in mobile handsets are typically stand-alone structures due to the difficulty in simultaneously achieving high power, high efficiency, and high linearity in the low-cost CMOS processes (or structures) used for the rest of the communications circuitry. Since power amplifiers are a significant drain on battery power in a mobile handset, the efficiency of a power amplifier should be maximized in the circuitry at a variety of power levels necessary for typical operation. However, in general, single path power amplifiers trade off linearity for increased efficiency, and are considered efficient only at peak output levels. In contrast, a Doherty amplifier configuration (also referred to herein as simply the "Doherty amplifier") allows for increased efficiency at levels lower than maximum output power by dynamically changing the load seen by part of the amplifier.

The Doherty amplifier includes a primary (carrier) amplifier that is placed in parallel with an auxiliary (peaking) amplifier or amplifiers. In the operation of a Doherty amplifier, the modulated load forces the carrier amplifier to reach its maximum voltage swing sooner, resulting in greater efficiency. The peaking amplifier is gradually turned on as input levels to the Doherty amplifier rise. A quarter wave transformer at the output of the primary path prevents the voltage swing of the carrier amplifier from becoming too large. Thus, efficiency is maintained without sacrificing linearity.

Figure 1:
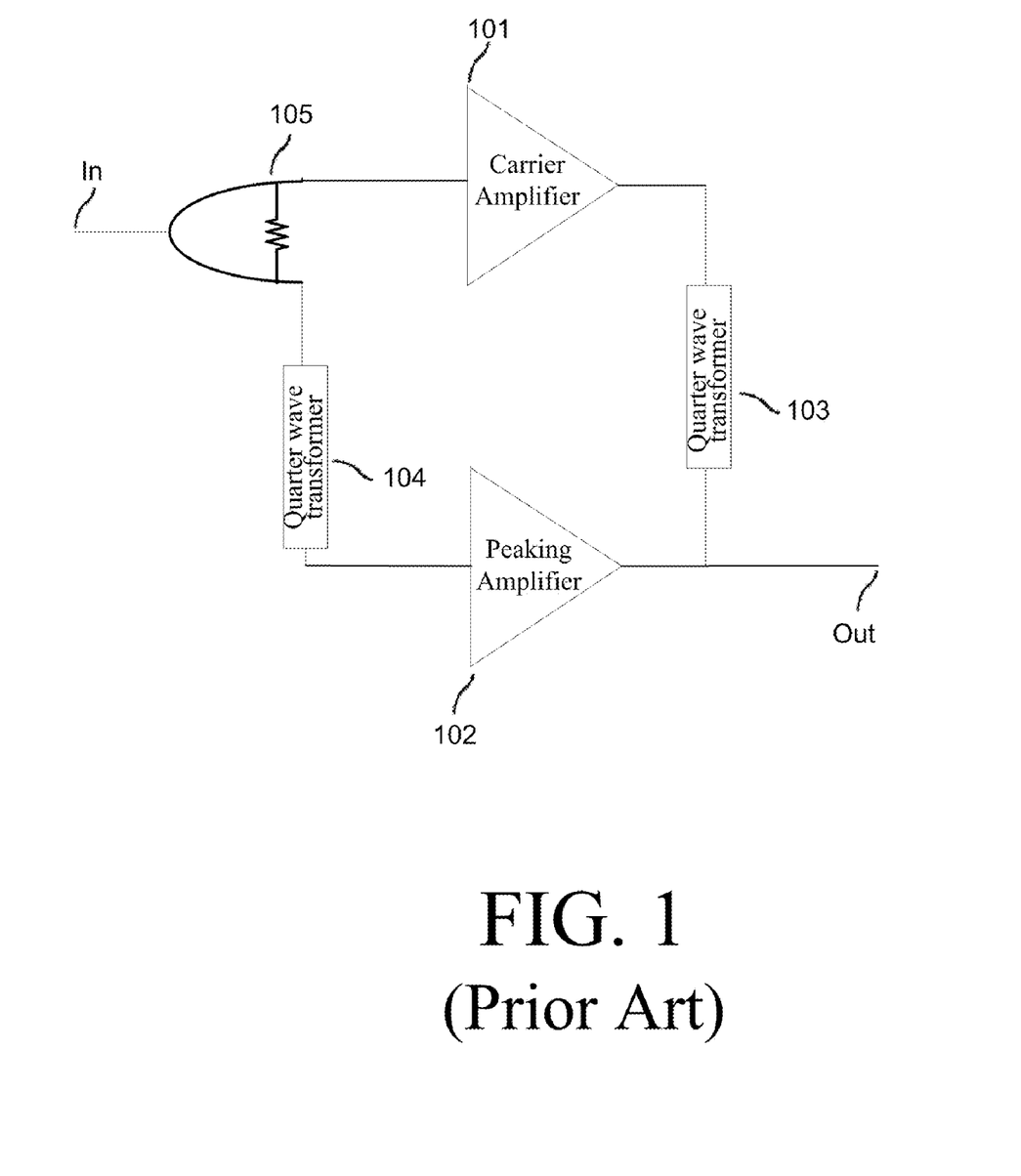
FIG. 1 illustrates a block diagram of a common configuration for a Doherty amplifier.

FIG. 1 illustrates a common configuration for a Doherty amplifier that includes a carrier amplifier 101 and a peaking amplifier 102 in parallel. As shown in FIG. 1, a power splitter 105 divides the power evenly between each path while a quarter wave transformer 103 is used to assist in modulating the carrier amplifier 101 load impedance. To equalize the path delay an additional quarter wave transformer 104 is placed before the peaking amplifier 102.

The gradual "turning on" of the peaking amplifier in a Doherty amplifier configuration is generally achieved by biasing transistors so that they operate below a threshold voltage level in order for appreciable current to flow, a bias point referred to as Class C. A Class C amplifier contributes a great deal of non-linearity due to its reduced conduction angle. In a typically non-linear process (or structure) such as CMOS, such non-linear operation of the amplifier(s) is unacceptable due to stringent linearity and power requirements in modern wireless communication standards. Moreover, a higher bias point reduces the efficiency of the Doherty amplifier by modulating the load at too low of an input power and thus preventing the carrier amplifier from reaching a maximal voltage swing. Therefore, the concept of adaptive bias is an attractive way to improve linearity without sacrificing current consumption or efficiency at output power levels less than maximum, such levels are generally referred to as back-off levels.

Figure 2:
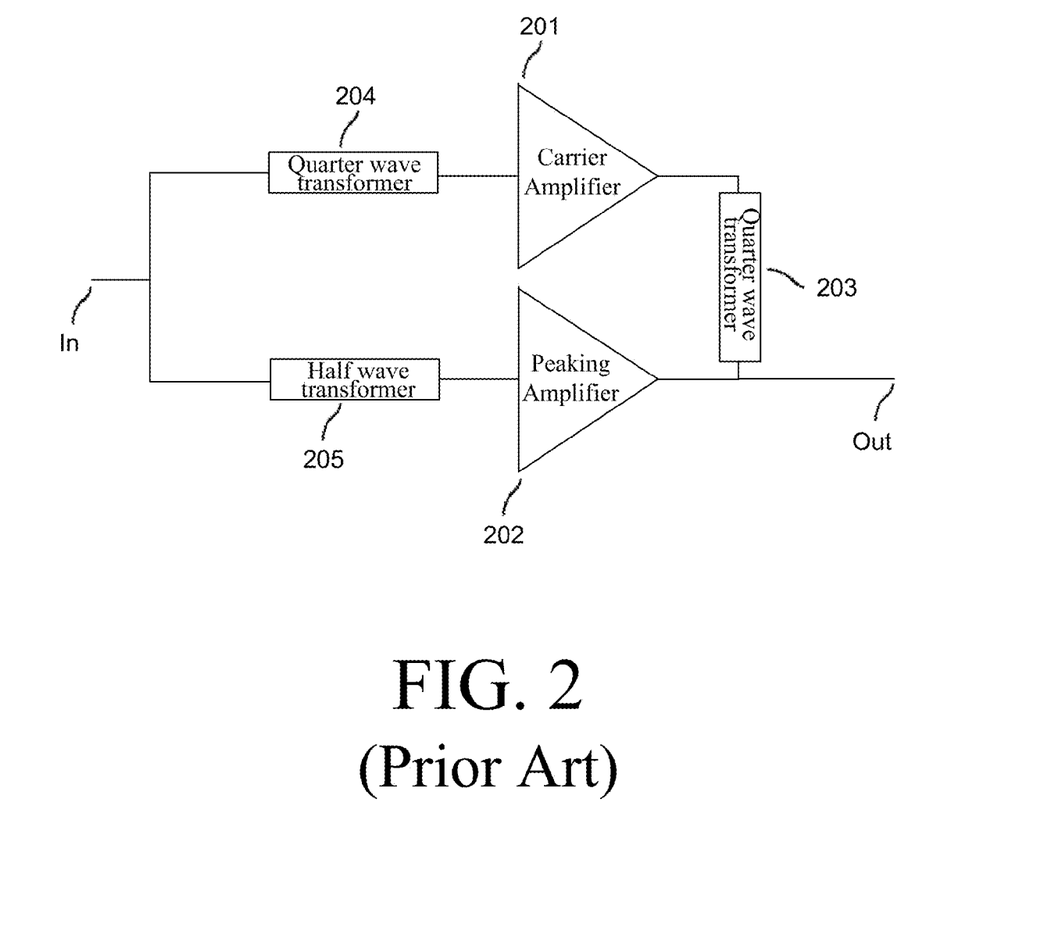
FIG. 2 illustrates a dynamically uneven Doherty linear power amplifier.

Heterojunction bipolar transistors (HBTs) dominate the power amplifier market. A self-biasing effect in bipolar junction transistors reduces the input impedance of a device as input power increases due to temperature effects. As set forth in *Doherty Linear Power Amplifiers for Mobile Handset Applications*, Kim et al., IEEE Proceedings of Asia-Pacific Microwave Conference 2006, one advantage of this impedance change is the possibility to employ dynamically uneven power drive. In this topology, illustrated in FIG. 2, the bulky power splitter 105 of the common Doherty amplifier configuration shown in FIG. 1 is removed from the design and replaced by additional (at or about) ("substantially") 90 degree lines along each path to take advantage of this effect, pushing more current to the more efficient peaking amplifier as input power increases. The opposite effect has been shown to occur in CMOS transistors, although the desired effect can be mimicked with a gradually increasing bias, at the expense of efficiency. As shown in FIG. 2, the carrier amplifier 201 and peaking amplifier 202 are now preceded by a quarter wave transformer 204 and a half wave transformer 205, respectively. Moreover, as shown in FIG. 2, a quarter wave transformer 203 follows the carrier amplifier as in FIG. 1.

Although uneven power drive appears attractive in terms of efficiency, layout area is not significantly reduced at cellular frequencies since transmission lines are not feasible, and therefore lumped element equivalents must be used. In general, a collection of passive components creating, for instance, a quarter wave transformer is called a lumped element equivalent circuit. Furthermore, in CMOS processes (or structures), linearity complications arise making it unattractive to implement dynamically uneven power drive as the desired efficiency gains must be sacrificed. Another complication in CMOS is low breakdown voltage compared to dominant power amplifier technologies. This deficiency leads to several topological choices, particularly a differential cascode structure. Typically the output and input baluns necessary for differential operation are large on-chip structures. In addition to the two lumped element quarter wave transformers necessary for Doherty amplifier operation, the area of these structures makes the topology highly inefficient with respect to layout area. What is needed is a way to reduce layout area space consumed with minimal sacrificing to performance.

BRIEF SUMMARY OF THE INVENTION

Example embodiments of the invention may include quarter wave transformers at the inputs of a carrier amplifier to achieve uneven power operation, but the peaking amplifier path transformer elements may be provided at the output side. This example configuration leverages the lower characteristic impedance necessary to the output side in order to reduce the amount of chip layout area consumed. Moreover, according to example embodiments of the invention, the output side balun and one quarter wave transformer may be combined into one structure that includes two quarter wave transformers mutually at or about ("substantially") 180 degrees out of phase, further shrinking the design and reducing the layout area needed. This is possible with lumped element quarter wave transformers which can achieve negative and positive (at or about) ("substantially") 90 degree phase shifts dependant on component placement. The configuration used in example embodiments of the invention may result in a compact linear amplifier in a CMOS process with improved efficiency in the back-off region and low quiescent current consumption.

According to an example embodiment of the invention, there is a power amplifier system. The system may include a carrier amplifier, where the carrier amplifier is connected to a first quarter wave transformer at the input of the carrier amplifier; at least one peaking amplifier connected in parallel with the carrier amplifier; a first differential combining structure, where the first differential combining structure includes a first plurality of quarter wave transformers that are configured to combine respective first differential outputs of the carrier amplifier in phase to generate a first single-ended output signal; a second differential combining structure, where the second differential combining structures includes a second plurality of quarter wave transformers that are configured to combine respective second differential outputs of the at least one peaking amplifier in phase to generate a second single-ended output signal, where the second plurality of quarter wave transformers are arranged to provide an equivalent cumulative delay and phase shift provided by the first quarter wave transformer and the first plurality of quarter wave transformers such that the first single-ended output signal and the second single-ended output signal are combinable in-phase to provide an overall output.

According to another example embodiment of the invention, there is another power amplifier system. The system may include a single carrier amplifier, where the single carrier amplifier is connected to an input quarter wave transformer at the input of a carrier amplifier; at least one peaking amplifier connected in parallel with the single carrier amplifier; a first differential combining structure, where the first differential combining structure includes a second quarter wave transformer and a third quarter wave transformer that are each respectively connected at one end to respective first differential outputs of the carrier amplifier and at another end to each other to form a first single-ended output, where the second and third quarter wave transformers operate substantially 180 degrees out of phase with respect to each other; and a second differential combining structure, where the second differential combining structure includes a first path that includes two output quarter wave transformers connected in series, and a second path that includes two output quarter wave transformers connected in series, wherein a first one of the two quarter wave transformers in both the first and second paths operate substantially 180 degrees out of phase with respect to each other, where a second one of the two output quarter wave transformers in both the first and second paths are phase-equivalent to the input quarter wave transformer, where a respective one of second differential outputs of the at least one peaking amplifier are provided as inputs to the respective first and second paths, wherein outputs from the first and second path are combined to generate the second single-ended signal, where the first and second single-ended signals are combinable in-phase to generate an overall output signal.

According to yet another example embodiment of the invention, there is another power amplifier system. The system may include a carrier amplifier, where the carrier amplifier is configured to receive a first input signal and generate first differential outputs, wherein the first differential outputs are processed by a first plurality of first quarter wave transformers and a first mismatch compensation block to generate a first single-ended output signal. The system may also include at least one peaking amplifier arranged in parallel with the carrier amplifier, where the at least one peaking amplifier is configured to receive a second input signal and generate second differential outputs, where the first input signal and the second input signal are derived at least in part from a same overall single-ended input signal, where the second differential outputs are processed by a second plurality of second quarter wave transformers and a second mismatch compensation block to generate a second signal-ended output signal, where the first plurality of first quarter wave transformers is configured relative to the second plurality of second quarter wave transformers such that the first single-ended output signal and the second single-ended output signal are combinable in-phase to generate an overall single-ended output signal.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may be directed to an integrated power amplification circuit for a mobile device (e.g., a mobile phone, radio, pager, laptop computer, handheld computer, personal digital assistant device, and the like) with improved efficiency and linearity properties while having minimal impact on circuit size and/or a reduction in integrated layout area consumed. In an example embodiment of the invention, an integrated power amplifier designed for cellular band frequencies in a standard CMOS process reduces and/or minimizes the layout area necessary to employ a two-stage Doherty amplifier with dynamically uneven power drive, while providing for differential combining and adaptively biased transistors. Example embodiments of the invention described herein utilize the properties of lumped element quarter wave transformers to accomplish the improved power amplification circuit, which may be provided by a collection of passive components.

In an example embodiment of the invention, through a particular placement of complementary lumped element structures, an example Doherty power amplifier configuration may be provided in a compact structure that achieves one or more of the following: reduced current consumption at reduced transmit power levels, increased efficiency at typical transmit power levels, and improved linearity properties at maximal transmit power levels. Additionally, the overall cost of the power amplifier may be reduced by providing a compact solution with additional savings also possible if manufactured in a process where further integration with mobile device circuitry is provided, according to an example embodiment of the invention.

According to an example embodiment of the invention, there may be a power amplifier system that includes a single carrier amplifier, where the single carrier amplifier is connected to a quarter wave transformer at the input of a carrier amplifier, and at least one peaking amplifier connected in parallel with the single carrier amplifier. The power amplifier system includes a first differential combining structure, where the first differential combining structure includes two lumped element quarter wave transformers mutually at or about ("substantially") 180 degrees out of phase separately connected at one end to differential outputs of the carrier amplifier and at the other end to each other to form a single ended output. The power amplifier system further includes a second differential combining structure, where the second differential combining structure includes two lumped element quarter wave transformers mutually at or about ("substantially") 180 degrees out of phase separately connected at one end to the differential outputs of a peaking amplifier and at the other end to two separate, yet phase-equivalent, lumped element quarter wave transformers. The two phase-equivalent lumped element quarter wave transformers are subsequently connected to each other and connected to the single ended output.

Figure 3:
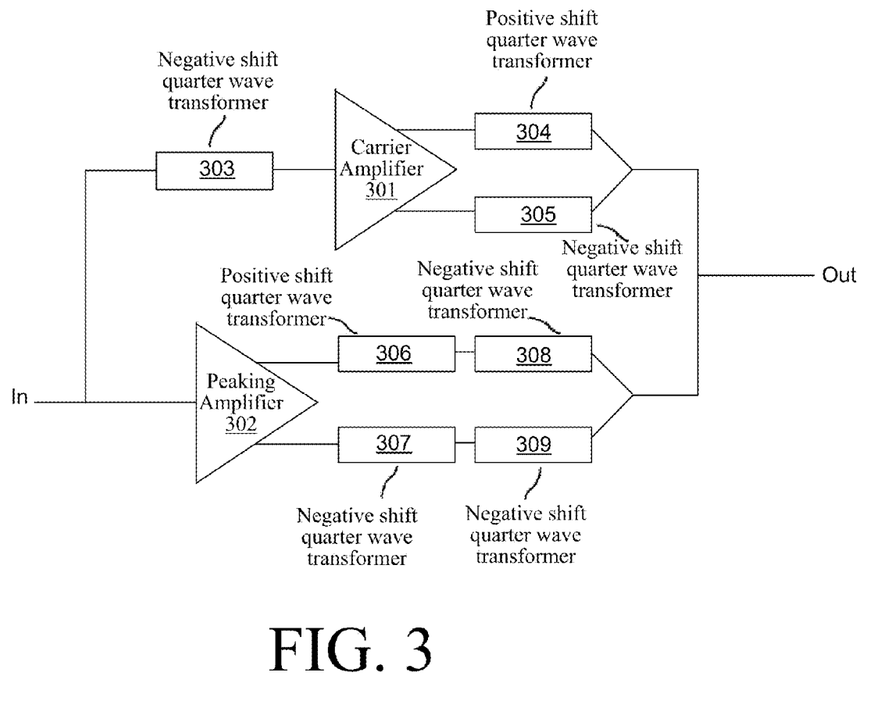
FIG. 3 illustrates an example block diagram of an integrated power amplifier system, according to an example embodiment of the invention.

FIG. 3 illustrates an example block diagram of an integrated power amplifier system 300, according to an example embodiment of the invention. The example system 300 of FIG. 3 may include a differential carrier amplifier 301 and one or more differential peaking amplifiers 302 that are connected in parallel. A negative shift quarter wave transformer 303 may precede an input(s) of the carrier amplifier 301.

The carrier amplifier 301 differential outputs may be provided to a first differential combining structure. The first differential combining structure may comprise a positive shift quarter wave transformer 304 along a first path and a negative shift quarter wave transformer 305 along a second path. In particular, a first differential output of the carrier amplifier 301 may be received by a first end of the positive shift quarter wave transformer 304 while a second differential output of the carrier amplifier 302 may be received by a first end of the negative shift quarter wave transformer 305. The positive shift quarter wave transformer 304 may be paired with a negative shift quarter wave transformer 305, which may have equivalent delays, in order to simultaneously load modulate and combine the carrier amplifier 301 differential outputs. The outputs of the transformers 304 and 305 may be combined in-phase to provide a single-ended output signal of the first differential combining structure. To do so, the second ends of transformers 304 and 305 may be tied or connected together. It will be appreciated that positive shift quarter wave transformer 304 and negative shift quarter wave transformer 305 may be operative at or about 180 degrees out of phase with respect to each other. Indeed, this results from positive shift quarter wave transformer 304 providing a positive (at or about) 90 degree phase shift while negative shift quarter wave transformer 305 provides a negative (at or about) 90 degree phase shift. Likewise, transformers 304 and 305 may provide equivalent delays so that the outputs of transformers 304 and 305 may be combined in-phase to provide a single-ended output signal of the first differential combining structure.

Similarly, the peaking amplifier 302 differential outputs may be provided to a second differential combining structure. The second differential combining structure may comprise a positive shift quarter wave transformer 306 and a negative shift quarter wave transformer 308 along a first path and negative shift quarter wave transformers 307, 309 along a second path. In particular, a first differential output of the peaking amplifier 302 may be received by a first end of the positive shift quarter wave transformer 306, which is connected at a second end in series with a first end of the negative shift quarter wave transformer 308. A second differential output of the peaking amplifier 302 may be received by a first end of the negative shift quarter wave transformer 307, which is connected at a second end in series with a first end the negative shift quarter wave transformer 309. The positive shift quarter wave transformer 306 may be paired with a negative shift quarter wave transformer 307, which may both have equivalent delays, in order to simultaneously combine the peaking differential outputs. In addition, two negative shift quarter wave transformers 308 and 309, which both have equivalent delays, may be connected at respective first end to the respective second end of respective transformers 306 and 307 to equalize the path delay and phase shift (of transformers 303, 304, 305 utilized with carrier amplifier 301).

The outputs of the transformers 308 (of the first path) and 309 (of the second path) may be combined in-phase to provide a single-ended output signal of the second differential combining structure. To do so, the second ends of the transformers 308 and 309 tied or connected together. In another example embodiment of the invention, quarter wave transformers 306 and 307 can be switched in position with respective quarter wave transformers 308 and 309. Other example embodiments of the invention may include the use of positive shift transformers for negative shift quarter wave transformers 303, 308, and 309 without departing from example embodiments of the invention. Other example embodiments of the invention may include alterations of transformers 308 and 309, where the two structures are combined into one negative shift structure, not necessarily limited in composition to passive components, for which the phase shift may be substantially greater or less than 90 degrees in order to compensate for a variety of number of performance issues, including, but not limited to, phase imbalance with the carrier path and output power leakage into the peaking path It will be appreciated that positive shift quarter wave transformer 306 and negative shift quarter wave transformer 307 may be at or about ("substantially") 180 degrees out of phase with respect to each other. Indeed, this results from positive shift quarter wave transformer 306 providing a positive (at or about) 90 degree phase shift while negative shift quarter wave transformer 307 provides a negative (at or about) 90 degree phase shift. On the other hand, negative shift quarter wave transformers 308, 309 may be phase-equivalent since both transformers 308, 309 may provide respective negative 90 degree phase shifts. Likewise, delays provided by transformers 306, 308 along the first path may be equivalent to the delays provided by transformers 307, 309 may be so that the outputs of transformers 304 and 305 may be combined in-phase to provide a single-ended output signal of the second differential combining structure.

It will be appreciated that the cumulative delays and phase shifts provided by the second differential combining structure may be the same as the delays and phase shifts provided by transformer 303 in combination with the first differential combining structure. Thus, the single-ended output signal of the first differential combining structure may be combinable in-phase with the single-ended output signal of the second differential combining structure to provide an overall single-ended output signal OUT, which may be an amplified version of the overall input single-ended input signal IN.

It will be appreciated that many example variations of FIG. 3 are available according to example embodiments of the invention. According to an example variation, input transformer 303 may be a positive shift quarter wave transformer. In this case, output transformers 308, 309, which may be utilized to equalize the phase shift and delay provided by input transformer 303 may likewise be positive shift quarter wave transformers. Likewise, as discussed earlier, since transformers 306, 308 are connected in series, their positions may be swapped without departing from example embodiments of the invention. Similarly, since transformers 307, 309 are also connected in series, their positions may be swapped without departing from example embodiments of the invention. In an example embodiment of the invention, the use of shunt inductors in the negative shift configuration may be preferable to leverage the inductance of bonding wires to reduce the layout area of the power amplifier chip by reducing the amount of inductance that must be provided on the chip. In another alternative variation, the input transformer 303 may be omitted and any shift or impedance transformation may simply be provided in combination by one or more other components (e.g., baluns, matching networks, amplifiers 301/302) at the input. In such an example embodiment, the first and second differential combining structure may be configured relative to each other such that the first single-ended output signal and the second single-ended output signal are combinable in-phase to generate the overall single-ended output signal OUT that may be an amplified version of the overall input single-ended input signal IN.

Figure 4:
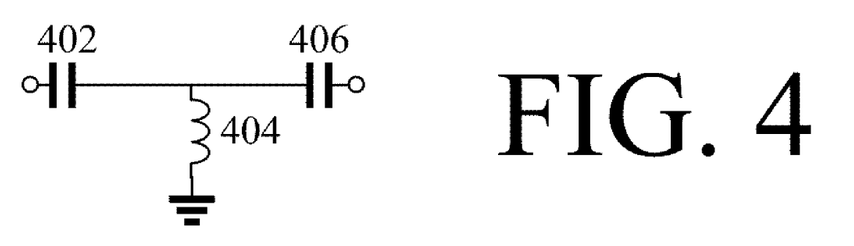
FIG. 4 illustrates an example circuit diagram of a negative shift quarter wave transformer in accordance with an example embodiment of the invention.
Figure 5:
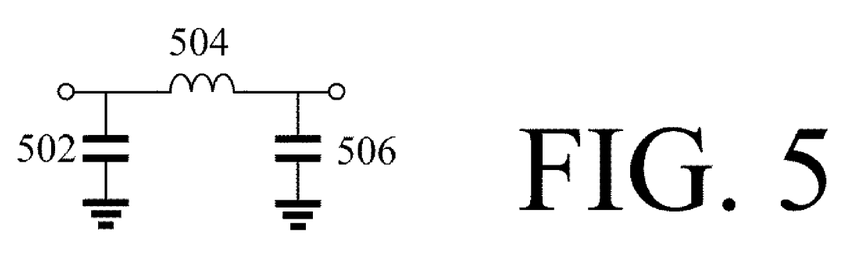
FIG. 5 illustrates an example circuit diagram of a positive shift quarter wave transformer in accordance with an example embodiment of the invention.

FIGS. 4 and 5 show two examples of single inductor lumped element equivalent circuits, according to an example embodiment of the invention. Both of the lumped element equivalent circuits shown in FIGS. 4 and 5 are a collection of passive components creating quarter wave transformers. More specifically, FIG. 4 illustrates an example circuit diagram of a negative shift quarter wave transformer in accordance with an example embodiment of the invention. As shown in FIG. 4, the negative shift quarter wave transformer may comprise capacitors 402, 406 and inductor 404 in a T configuration. The capacitors 402 and 406 may be connected in series to each other, and the inductor 404 may have a first end connected between capacitors 402 and 406 and a second end connected to ground. FIG. 5 illustrates an example circuit diagram of a positive shift quarter wave transformer in accordance with an example embodiment of the invention. As shown in FIG. 5, the positive shift quarter wave transformer may comprise capacitors 502, 506 and inductor 504 in a Pi configuration. A first end of the inductor 504 may be connected to capacitor 502 while a second end of the inductor 504 may be connected to capacitor 504. The remaining ends of capacitors 502, 506 may be connected to ground.

Figure 6:
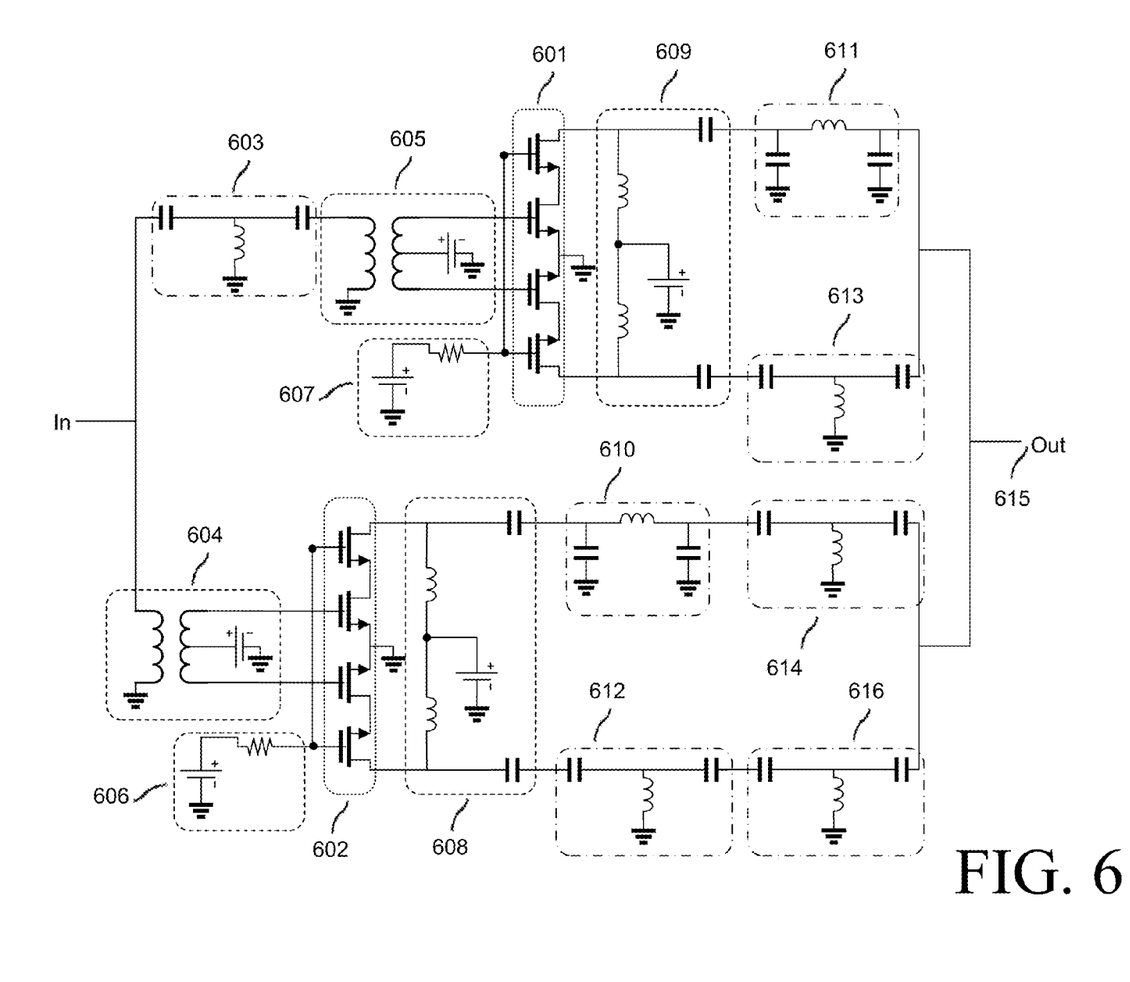
FIG. 6 illustrates a component level schematic of an integrated power amplifier system, according to an example embodiment of the invention.

FIG. 6 shows an example component level schematic of an example embodiment of the invention. As shown in the example embodiment of FIG. 6, there is a primary amplification block 601, which may be representative of a carrier amplifier. Likewise, there is at least one auxiliary amplification block 602, which may be representative of a peaking amplifier. The primary amplification block 601 and auxiliary amplification block 602 may comprise differential cascode CMOS transistors, according to an example embodiment of the invention.

As shown in FIG. 6, a single-ended input signal IN (e.g., an RF input signal) may be provided along a first signal path toward the inputs of primary amplification block 601, and along a second signal path toward the inputs of the auxiliary amplification block 602. In the first signal path, a negative shift lumped element quarter wave transformer block 603 may precede the inputs of the primary amplification circuitry 601. The phase-shifted single-ended signal may be provided from block 603 to the input balun block 605. The input balun block 605 may be operative to convert a single-ended signal to differential signals. More specifically, the input balun block 605 may include a primary winding and a second winding, and optionally one or more additional components (e.g., resistors, capacitors, inductors, etc.) for power matching. A first end of the primary winding may receive, as an input, the phase-shifted single-ended signal from block 603, and the second end of the primary winding may be connected to ground. The secondary winding may be inductively coupled to the primary winding, and both ends of the secondary winding may serve as outputs for the generated differential signals, which are received by the primary amplification block 601. Where primary amplification block 601 includes transistors such as field-effect transistors (FET) having respective gates, sources, and drains, the ends of the secondary winding may be connected to respective gates of respective FETs.

Alternatively, if bipolar junction transistors (BJTs) (or other heterojunction bipolar transistors (HBTs)) having respective bases, emitters, and collectors are utilized instead of FETs, then the ends of the secondary winding may be connected to respective bases of respective BJTs. It will be appreciated that the center tap port of the secondary winding, which is typically at a virtual ground, can also be connected to a voltage source for biasing the gates (or bases). Additional gate (or base) biasing may be provided by block 607, which may include a voltage source and a biasing resistor. It will be appreciated that various adaptive biasing methods are available for biasing the gate (or base), as similarly described in U.S. patent application Ser. No. 12/620,462, filed on Nov. 17, 2009, and entitled "SYSTEMS AND METHODS FOR AN ADAPTIVE BIAS CIRCUIT FOR A DIFFERENTIAL POWER AMPLIFIER", which is hereby incorporated by reference. The adaptive biasing can be used to minimize quiescent current at low power levels while simultaneously decreasing the equivalent input resistance of the amplifier (i.e., amplification block 601). Drain (or collector) biasing and output matching for the primary amplification block 601, if needed, may be accomplished through matching block 609, which may include the illustrated combination of inductors and capacitors, along with a voltage source. The drain (or collector) biasing and the output matching for the primary amplification block 601 may be designed to optimize back-off efficiency.

The differential outputs of the primary amplification block 601 may be provided to a first differential combining structure that comprises quarter wave transformers 611, 613, which provides the appropriate positive or negative quarter wave phase shifting and delay as described herein. More specifically, a first differential output of the primary amplification block 601 is provided to positive shift lumped element equivalent quarter wave transformer 611 while a second differential output of the primary amplification block is provided to negative shift lumped element equivalent quarter wave transformer 613. The outputs of quarter wave transformers 611, 613 may be combined or summed to generate a single-ended first output signal for the first differential combining structure.

As described above, the single-ended input signal IN may also be provided along a second signal path toward the inputs of the auxiliary amplification block 602. Along this second signal path, the single-ended input signal IN may be received by the input balun block 604. The input balun block 604 may be operative to convert a single-ended signal to differential signals. More specifically, the input balun block 604 may include a primary winding and a second winding, and optionally one or more additional components (e.g., resistors, capacitors, inductors, etc.) for power matching. A first end of the primary winding may receive, as an input, the single-ended input signal IN, and the second end of the primary winding may be connected to ground. The secondary winding may be inductively coupled to the primary winding, and both ends of the secondary winding may serve as outputs for the generated differential signals, which are received by the auxiliary amplification block 602. Where the auxiliary amplification block 602 includes transistors such as field-effect transistors (FET) having respective gates, sources, and drains, the ends of the secondary winding may be connected to respective gates of respective FETs. Alternatively, if bipolar junction transistors (BJTs) having respective bases, emitters, and collectors are utilized instead of FETs, then the ends of the secondary winding may be connected to respective bases of respective BJTs. It will be appreciated that the center tap port of the secondary winding, which is typically at a virtual ground, can also be connected to a voltage source for biasing the gates (or bases). Additional gate (or base) biasing may be provided by block 606, which may include a voltage source and a biasing resistor. It will be appreciated that various adaptive biasing methods are available for biasing the gate (or base), as similarly described herein. The adaptive biasing can be used to minimize quiescent current at low power levels while simultaneously decreasing the equivalent input resistance of the amplifier (i.e., amplification block 602). Drain (or collector) biasing and output matching for the auxiliary amplification block 602 may be accomplished, if needed, through matching block 608, which may include the illustrated combination of inductors and capacitors, along with a voltage source. The drain (or collector) biasing and output matching for the auxiliary amplification block 602 may be designed to minimize leakage from the carrier amplifier into the output of the peaking amplifier or amplifiers.

The differential outputs of the auxiliary amplification block 602 may be provided to a second differential combining structure that comprises quarter wave transformers 610, 612, 614, and 616, which provide the appropriate positive or negative quarter wave phase shifting and delay as described herein. More specifically, a first differential output of the auxiliary amplification block 602 is provided to a positive shift lumped element equivalent quarter wave transformer 610, which is connected in series to a negative shift lumped element equivalent quarter wave transformer 614. On the other hand, a second differential output of the auxiliary amplification block 602 is provided to a negative shift lumped element equivalent quarter wave transformer 612, which itself is connected in series to another negative shift lumped element equivalent quarter wave transformer 616. The outputs of quarter wave transformers 614, 616 may be combined or summed to generate a single-ended second output signal for the second differential combining structure.

The respective single-end output signals generated by the respective first and second differential combining structure may then be combined or summed to generate the overall single-ended output signal OUT 615. In an example embodiment of the invention, additional matching may be utilized at the output 615, and the input IN may be matched to the previous amplification stage. Additionally, an input side matching components or scheme incorporated into input balun block 604, 605 (and dependent on the impedance of input IN) may be designed to divide power between each amplifier (primary/auxiliary amplification sections 601, 602 path in inverse proportion to the dynamically changing equivalent resistances seen at each path input). Such an input side matching scheme may provide an ideal match when the input power reaches a level corresponding to the maximum linear output of the amplifier, according to an example embodiment of the invention.

Figure 7:
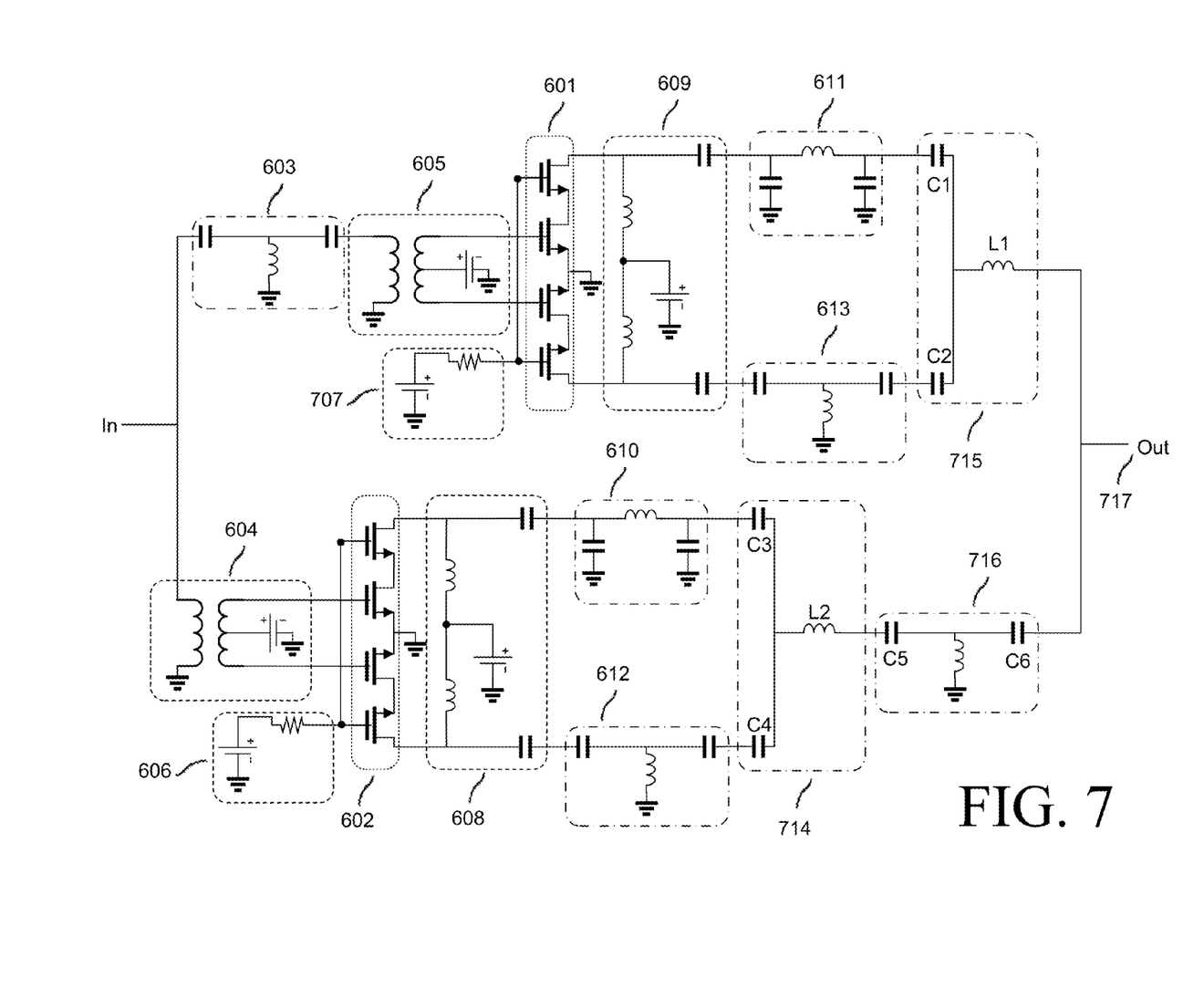
FIG. 7 illustrates an alternative component level schematic of an integrated power amplifier system, wherein additional components are added to compensate for notches in the band of operation due to component mismatch, according to an example embodiment of the invention.

FIG. 7 illustrates an example variation of the schematic of FIG. 6 in accordance with an example embodiment of the invention. As shown in FIGS. 6 and 7, components 601-613 may remain the same. However, quarter wave transformers 614, 616 in FIG. 6 may be replaced by a single quarter wave transformer 716, which may compensate for any phase offset of the input quarter wave transformer 603. In addition, mismatch compensation blocks 714, 715 may provided at the outputs of the quarter wave transformers 611/613 and 610/612, respectively, to eliminate one or more notches that may be inherently in the band of operation due to any component mismatch in the quarter wave lumped element equivalents.

Still referring to FIG. 7, mismatch compensation block 715 may include a capacitor C1 connected to quarter wave transformer 611 and a capacitor C2 connected to the quarter wave transformer 613. The opposite ends of capacitors C1, C2 may be commonly connected to a first end of the inductor L1, and a second end of the inductor L1 may provide a first single-ended signal that contributes to the overall single-ended output signal OUT 717. Similarly, the compensation block 714 may include a capacitor C3 connected to quarter wave transformer 610 and a capacitor C4 connected to quarter wave transformer 612. The opposite ends of capacitors C3, C4 may be commonly connected to a first end of the inductor L2, and a second end of the inductor L2 may provide a second single-ended signal to an input of the single quarter wave transformer 716. The output of the quarter wave transformer 716 may provide a second single-ended signal that contributes to the overall single-ended output signal OUT 717. Indeed, the overall single-ended output signal OUT 717 is obtained by connecting the outputs of the compensation block 715 (providing the first single-ended signal) and the quarter wave transformer 716 (providing the second single-ended signal). It will be appreciated that the components of compensation blocks 714 and 715 may be selected such that in combination there is no effect to the 90 degree phase shift or impedance transformation created by the prior quarter wave transformers.

It will also be appreciated that many variations of FIG. 6 or 7 are available without departing from example embodiments of the invention. As an example, another variation may include the elimination of input quarter wave transformer 603. Instead, the quarter wave phase shift or impedance transformation may instead be provided by input balun block 605 and/or the primary amplification block 601, either alone or in combination with input balun block 604 and the auxiliary amplification block 602.

Figure 8:
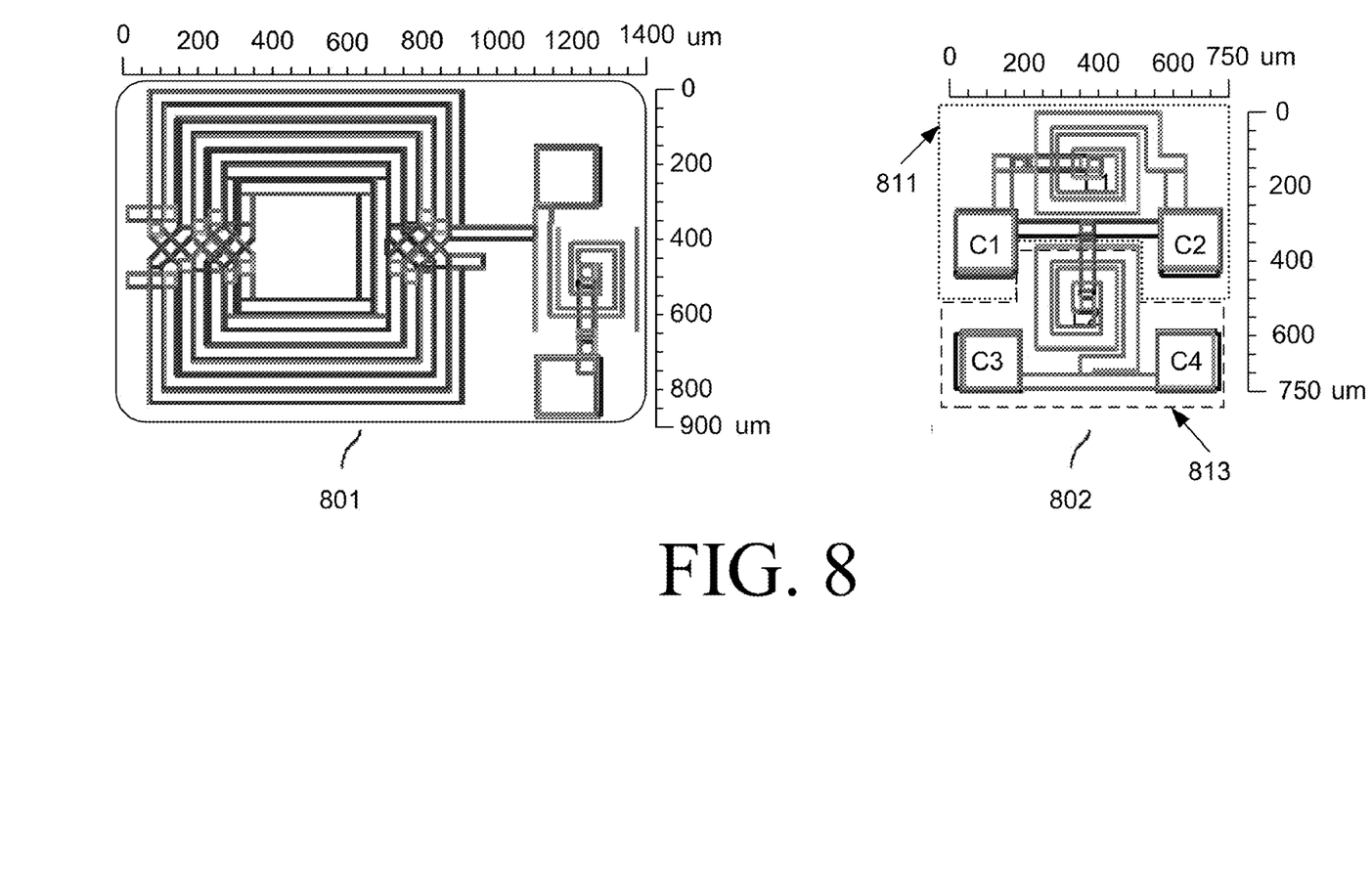
FIG. 8 illustrates a side-by-side comparison of a conventional carrier path output structure in a 2 GHz implementation and an example carrier path output structure in a 2 GHz implementation in accordance with an example embodiment of the invention.
Figure 9:
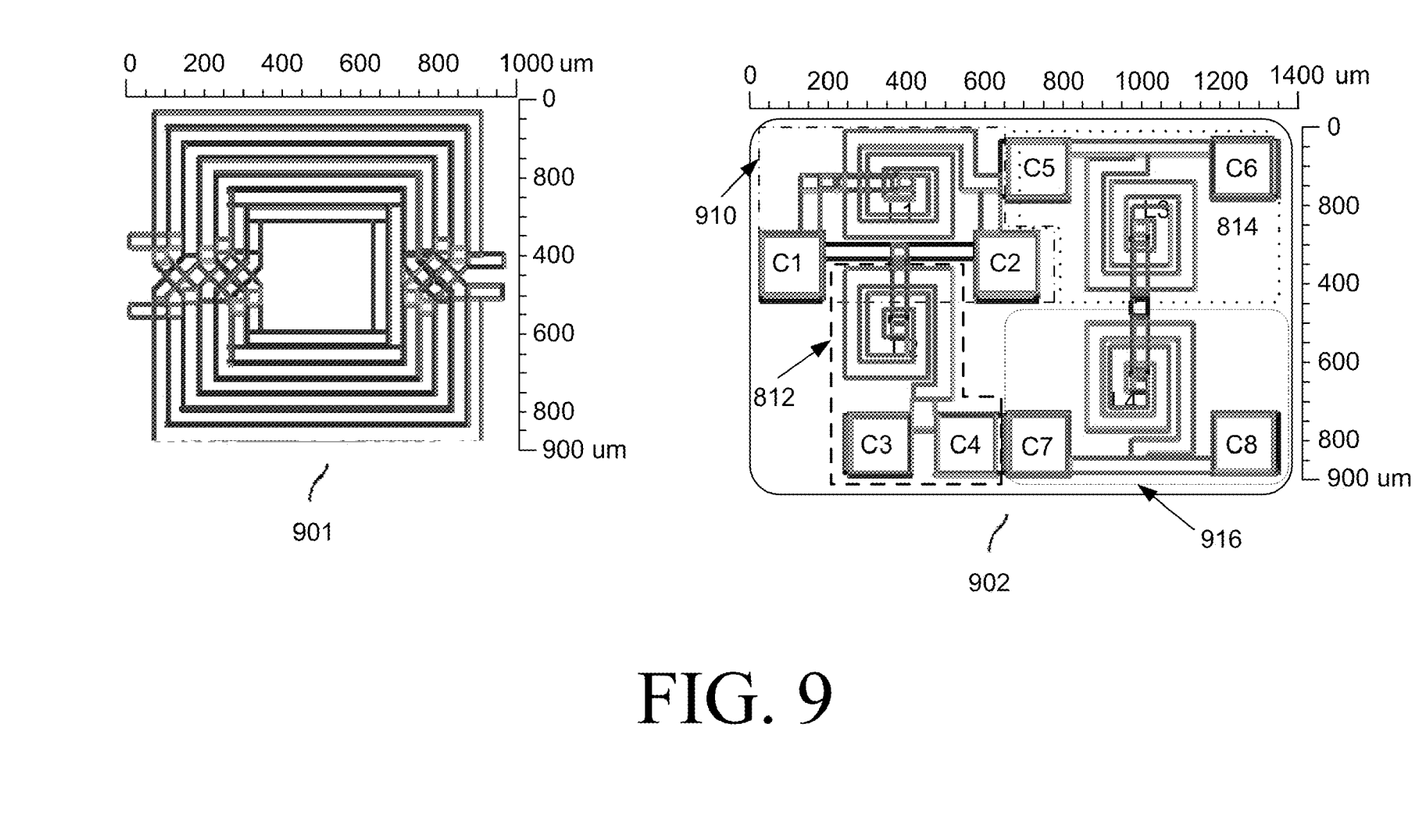
FIG. 9 illustrates a side-by-side layout comparison of a conventional peaking path output structures in a 2 GHz implementation and a peaking path output structures in a 2 GHz implementation in accordance with an example embodiment of the invention.

It may be difficult to quantify the layout savings across all embodiments of the invention as structure size varies with performance and frequency, but for illustrative purposes the trade-offs between conventional structures and structures of example embodiments of the invention are illustrated in FIGS. 8 and 9. Thus, the general nature of layout savings possible by example embodiments of the invention is illustrated in FIGS. 8 and 9.

FIG. 8 illustrates a side-by-side comparison of a conventional carrier path output structure 701 in a 2 GHz implementation and an example carrier path output structure 802 in a 2 GHz implementation in accordance with an example embodiment of the invention. As shown in FIG. 8, the conventional structure 801 based upon the current state of the art in a CMOS process is shown to be larger than the new structure 802, which may be implemented at least in part in accordance with an example embodiment of the invention. In accordance with an example embodiment of the invention, the structure in 802 may be equivalent to blocks 611 and 613 of FIG. 6 combined, or likewise equivalent to blocks 610 and 612 combined, as the latter pair may be substantially the same in structure as the former pair. For example, FIG. 8 illustrates a positive shift quarter wave transformer 811, which may be equivalent to block 611, that includes capacitors C1, C2 and inductor L1. Likewise, FIG. 8 also illustrates a negative shift quarter wave transformer 813, which may be equivalent to block 613, having capacitors C3, C4 and inductor L2.

FIG. 9 illustrates a side-by-side layout comparison of a conventional peaking path output structure 901 in a 2 GHz implementation and an example peaking path output structure 902 in a 2 GHz implementation in accordance with an example embodiment of the invention. As shown in FIG. 9, the conventional structure 901 based upon current state of the art in a CMOS process is shown to be smaller than the new example structure 902, which is at least part of an example embodiment of the invention. In accordance with an example embodiment of the invention, the structure in 802 may be equivalent to FIG. 6, blocks 610, 612, 614, and 616, combined. For example, FIG. 9 illustrates a positive shift quarter wave transformer 910, which may be equivalent to block 610, that includes capacitors C1, C2 and inductor L1. In addition, negative shift quarter wave transformer 912, which includes capacitors C3, C4 and inductor L2, may be equivalent to block 612. Negative shift quarter wave transformer 914, which includes capacitors C5, C6 and inductor L3, may be equivalent to block 614. Likewise, negative shift quarter wave transformer 816, which includes capacitors C7, C8, may be equivalent to block 616. It will be appreciated that although the structure 902 may consume more area than the conventional structure in 901, the structure 902 provides an added benefit of eliminating the need for a power splitter, which itself may be larger than the size of 902.

Figure 10:
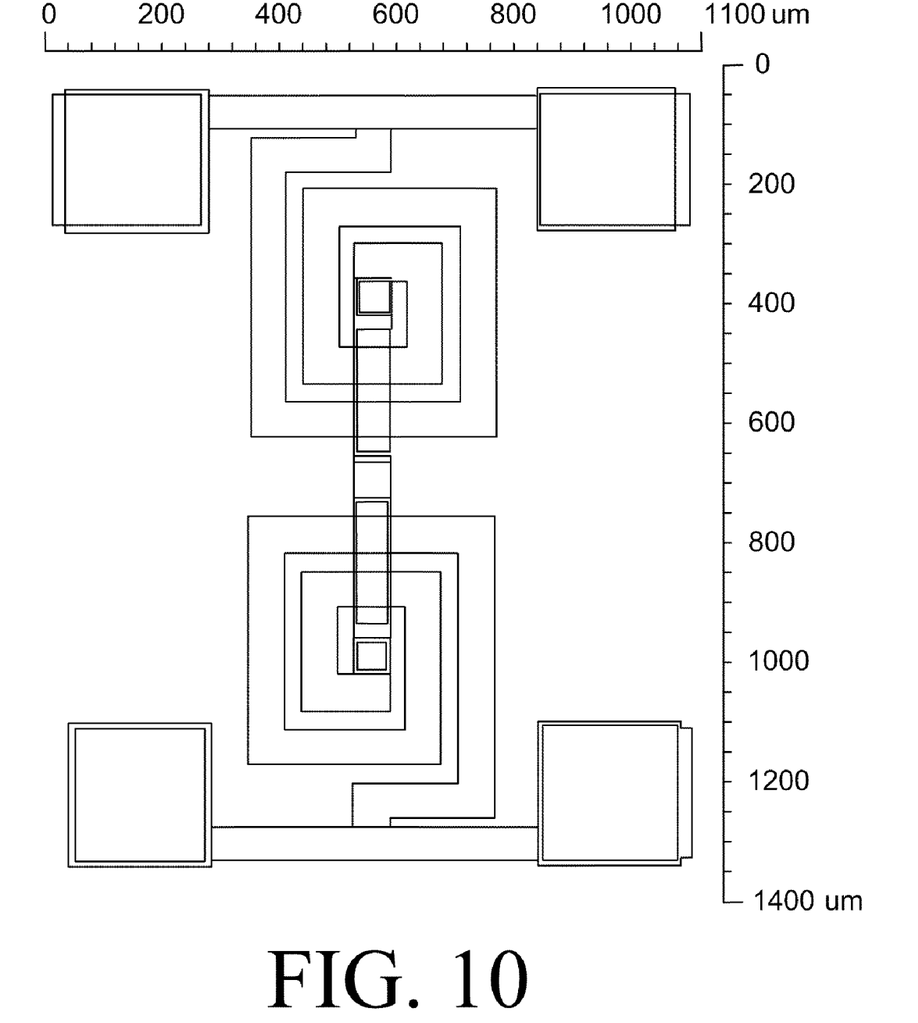
FIG. 10 illustrates an example layout for a power splitter at 2 GHz containing the basic structures necessary for one example implementation of a Wilkinson power divider in an example embodiment of the invention.

FIG. 10 illustrates an example layout for a power splitter at 2 GHz containing the basic structures necessary for one implementation of what is known as a Wilkinson power divider. FIG. 10 is provided to show the area saved in various embodiments of the invention through the elimination of the power splitter. Additional structures are not compared herein, as they would be substantially similar and hence consume substantially the same area.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A power amplifier system, comprising:
a carrier amplifier, wherein the carrier amplifier is connected to a first quarter wave transformer at the input of the carrier amplifier;
at least one peaking amplifier connected in parallel with the carrier amplifier;
a first differential combining structure, wherein the first differential combining structure includes a first plurality of quarter wave transformers that are configured to combine respective first differential outputs of the carrier amplifier in phase to generate a first single-ended output signal; and
a second differential combining structure, wherein the second differential combining structure includes a second plurality of quarter wave transformers that are configured to combine respective second differential outputs of the at least one peaking amplifier in phase to generate a second single-ended output signal,
wherein the second plurality of quarter wave transformers are arranged to provide an equivalent cumulative delay and phase shift provided by the first quarter wave transformer and the first plurality of quarter wave transformers such that the first single-ended output signal and the second single-ended output signal are combinable in-phase to provide an overall output.

2. The power amplifier system of claim 1, wherein the first plurality of second quarter wave transformers comprises a second quarter wave transformer and a third quarter wave transformer each having a respective first end and second end, wherein the second quarter wave transformer and the third quarter wave transformer are operative substantially 180 degrees out of phase with respect to each other, wherein the respective first ends of the second and third quarter wave transformers are each connected to a respective one of the first differential outputs of the carrier amplifier, wherein the respective second ends of the second and third quarter wave transformers are connected together to generate the first single-ended output.

3. The power amplifier system of claim 2, wherein:
the second plurality of third quarter wave transformers comprises a fourth quarter wave transformer, a fifth quarter wave transformer, a sixth quarter wave transformer, and a seventh quarter wave transformer each having a respective first end and a second end, wherein the respective first ends of the fourth and fifth quarter wave transformers are each connected to a respective one of the second differential outputs of the at least one peaking amplifier, wherein the second end of the fourth quarter wave transformer is connected to the first end of the sixth quarter wave transformer, and the second end of the fifth quarter wave transformer is connected to the first end of the seventh quarter wave transformer, wherein the second ends of the sixth and seventh quarter wave transformers are connected together to generate the second single-ended output.

4. The power amplifier system of claim 3, wherein the first, third, fifth, sixth, and seventh quarter wave transformers are negative shift quarter wave transformers, and wherein the second and fourth quarter wave transformers are positive shift quarter wave transformers.

5. The power amplifier system of claim 3, wherein either: (1) the fourth and fifth quarter wave transformers are operative substantially 180 degrees out of phase with respect to each other, and the sixth and seventh quarter wave transformers are phase equivalent, or (2) the fourth and fifth quarter wave transformers are phase equivalent, and the sixth and seventh quarter wave transformers are operative substantially 180 degrees out of phase with respect to each other.

6. The power amplifier system of claim 1, wherein each quarter wave transformer of the first and second plurality of quarter wave transformers comprises lumped elements arranged in either a T configuration or a Pi configuration.

7. The power amplifier system of claim 1, further comprising:
an adaptive bias structure that provides an adaptive input bias for one or both of the carrier amplifier or the at least one peaking amplifier, wherein the adaptive input bias is configured to minimize quiescent current at low power levels while decreasing an equivalent input resistance for the respective carrier amplifier or the at least one peaking amplifier.

8. The power amplifier system of claim 1, further comprising:
a first matching block provided between the carrier amplifier and the first differential combining structure, wherein the first matching block is configured to maximize a back-off efficiency of the carrier amplifier; and
a second matching block provided between the at least one peaking amplifier and the second differential combining structure, wherein the second matching block is configured to minimize leakage current to overall output when the at least one peaking amplifier is dormant or contributing minimal power to the overall output.

9. The power amplifier system of claim 1, further comprising:
a first balun positioned between the first quarter wave transformer and the carrier amplifier, wherein the first quarter wave transformer receives a single-ended input signal and provides a phase-shifted single-ended input signal to the first balun, wherein the first balun is configured to convert the phase-shifted single-ended signal to first differential input signals for receipt by the carrier amplifier; and
a second balun, wherein the second balun converts the single-ended input signal to second differential input signals for receipt by the at least one peaking amplifier.

10. The power amplifier system of claim 9, wherein the first balun further includes first input side matching components, and wherein the second balun further includes second input side matching components, the first and second input side matching components for matching an impedance associated with the single-ended input signal.

11. A power amplifier system, comprising:
a single carrier amplifier, wherein the single carrier amplifier is connected to an input quarter wave transformer at the input of a carrier amplifier;
at least one peaking amplifier connected in parallel with the single carrier amplifier;
a first differential combining structure, wherein the first differential combining structure includes a second quarter wave transformer and a third quarter wave transformer that are each respectively connected at one end to respective first differential outputs of the carrier amplifier and at another end to each other to form a first single-ended output, wherein the second and third quarter wave transformers operate substantially 180 degrees out of phase with respect to each other; and
a second differential combining structure, wherein the second differential combining structure includes a first path that includes two output quarter wave transformers connected in series, and a second path that includes two output quarter wave transformers connected in series, wherein a first one of the two quarter wave transformers in both the first and second paths operates substantially 180 degrees out of phase with respect to each other, wherein a second one of the two output quarter wave transformers in both the first and second paths is phase-equivalent to the input quarter wave transformer, wherein a respective one of second differential outputs of the at least one peaking amplifier is provided as inputs to the respective first and second paths, wherein outputs from the first and second path are combined to generate the second single-ended signal, wherein the first and second single-ended signals are combinable in-phase to generate an overall output signal.

12. The power amplifier system of claim 11, wherein the input quarter wave transformer is either a positive shift quarter wave transformer or negative shift quarter wave transformer.

13. The power amplifier system of claim 12, wherein the input quarter wave transformer is a first negative shift quarter wave transformer, wherein the two output quarter wave transformers of the first path include a first positive shift quarter wave transformer and a second negative shift quarter wave transformer, wherein the two output quarter wave transformers of the second path include a third negative shift quarter wave transformer and a fourth negative shift quarter wave transformer.

14. The power amplifier system of claim 12, wherein the input quarter wave transformer is a first positive shift quarter wave transformer, and wherein the two output quarter wave transformers of the first path include a second positive shift quarter wave transformer and a third positive shift quarter wave transformer, wherein the two output quarter wave transformers of the second path comprise a first negative shift quarter wave transformer and a fourth positive shift quarter wave transformer.

15. The power amplifier system of claim 11, further comprising:
an adaptive bias structure that provides an adaptive input bias for one or both of the single carrier amplifier or the at least one peaking amplifier, wherein the adaptive input bias is configured to minimize quiescent current at low power levels while decreasing an equivalent input resistance for the respective carrier amplifier or the at least one peaking amplifier.

16. The power amplifier system of claim 11, further comprising:
a first matching block provided between the single carrier amplifier and the first differential combining structure, wherein the first matching block is configured to maximize a back-off efficiency of the carrier amplifier; and a second matching block provided between the at least one peaking amplifier and the second differential combining structure, wherein the second matching block is configured to minimize leakage current to overall output when the at least one peaking amplifier is dormant or contributing minimal power to the overall output.

17. The power amplifier system of claim 11, further comprising:
a first balun positioned between the first quarter wave transformer and the single carrier amplifier, wherein the first quarter wave transformer receives a single-ended input signal and provides a phase-shifted single-ended input signal to the first balun, wherein the first balun is configured to convert the phase-shifted single-ended signal to first differential input signals for receipt by the carrier amplifier; and
a second balun, wherein the second balun converts the single-ended input signal to second differential input signals for receipt by the at least one peaking amplifier.

18. The power amplifier system of claim 17, wherein the first balun further includes first input side matching components, and wherein the second balun further includes second input side matching components, the first and second input side matching components for matching an impedance associated with the single-ended input signal.

19. A power amplifier system, comprising:
a carrier amplifier, wherein the carrier amplifier is configured to receive a first input signal and generate first differential outputs, wherein the first differential outputs are processed by a first plurality of first quarter wave transformers and a first mismatch compensation block to generate a first single-ended output signal;
at least one peaking amplifier arranged in parallel with the carrier amplifier, wherein the at least one peaking amplifier is configured to receive a second input signal and generate second differential outputs, wherein the first input signal and the second input signal are derived at least in part from a same overall single-ended input signal, wherein the second differential outputs are processed by a second plurality of second quarter wave transformers and a second mismatch compensation block to generate a second signal-ended output signal, wherein the first plurality of first quarter wave transformers is configured relative to the second plurality of second quarter wave transformers such that the first single-ended output signal and the second single-ended output signal are combinable in-phase to generate an overall single-ended output signal.

20. The power amplifier system of claim 19, wherein the first mismatch compensation block and the second mismatch compensation block are configured to eliminate one or more notches present in a band of operation due to component mismatches present in one or more transformers of the first plurality of first quarter wave transformers or the second plurality of second quarter wave transformers.

* * * * *